United States Patent
Nishi et al.

(10) Patent No.: US 8,653,380 B2
(45) Date of Patent: Feb. 18, 2014

(54) SOLAR CELL LEAD, METHOD OF MANUFACTURING THE SAME, AND SOLAR CELL USING THE SAME

(75) Inventors: Hajime Nishi, Hitachi (JP); Ken Takahashi, Mito (JP); Hiromitsu Kuroda, Hitachi (JP); Hiroshi Okikawa, Hitachi (JP); Kuniaki Kimoto, Hitachi (JP); Hiroyuki Akutsu, Hitachi (JP); Yukio Ito, Hitachi (JP); Iku Higashidani, Hitachi (JP)

(73) Assignees: Hitachi Cable, Ltd., Tokyo (JP); Hitachi Cable Fine-Tech, Ltd., Hitachi-Shi, Ibaraki (JP)

( * ) Notice: Subject to any disclaimer, the term of this patent is extended or adjusted under 35 U.S.C. 154(b) by 446 days.

(21) Appl. No.: 12/659,172

(22) Filed: Feb. 26, 2010

(65) Prior Publication Data
US 2010/0218981 A1 Sep. 2, 2010

(30) Foreign Application Priority Data
Feb. 27, 2009 (JP) .................................. 2009-047033

(51) Int. Cl.
*H05K 1/16* (2006.01)
(52) U.S. Cl.
USPC ............ 174/260; 174/261; 174/262; 174/263
(58) Field of Classification Search
None
See application file for complete search history.

(56) References Cited

U.S. PATENT DOCUMENTS

| | | | |
|---|---|---|---|
| 4,562,637 A * | 1/1986 | Kushima et al. | 219/121.64 |
| 2002/0012608 A1* | 1/2002 | Takaoka et al. | 420/561 |
| 2003/0024733 A1* | 2/2003 | Aoyama et al. | 174/260 |
| 2006/0272843 A1 | 12/2006 | Berghofer et al. | |
| 2006/0272844 A1 | 12/2006 | Berghofer et al. | |
| 2007/0017570 A1 | 1/2007 | Endo et al. | |
| 2008/0076307 A1 | 3/2008 | Nishi et al. | |
| 2008/0206587 A1* | 8/2008 | Kainuma et al. | 428/615 |

FOREIGN PATENT DOCUMENTS

| | | |
|---|---|---|
| CN | 101145586 A | 3/2008 |
| EP | 1 626 443 A1 | 5/2004 |
| JP | 09-321425 A | 12/1997 |
| JP | 11-21660 A | 1/1999 |
| JP | 2006-49666 A | 2/2006 |

(Continued)

OTHER PUBLICATIONS

Chinese Office Action dated Aug. 26, 2011, with English translation.

(Continued)

*Primary Examiner* — Tuan T Dinh
*Assistant Examiner* — Steven Sawyer
(74) *Attorney, Agent, or Firm* — McGinn IP Law Group, PLLC

(57) ABSTRACT

A solar cell lead includes a strip plate conductive material that a surface thereof is coated with solder plating. The coated solder plating includes a concavo-convex portion on a surface thereof and a 0.2% proof stress of not more than 90 MPa by a tensile test. The coated solder plating includes a hot-dip solder plating layer formed by supplying a molten solder on the surface of the strip plate conductive material. A plating temperature is set to be not higher than a liquidus-line temperature of the used solder plus 120° C., and an oxide film on a surface of the hot-dip solder plating layer is set to be not more than 7 nm in thickness.

12 Claims, 6 Drawing Sheets

(56) References Cited

FOREIGN PATENT DOCUMENTS

| JP | 2007-141930 A | 6/2007 |
|----|---------------|--------|
| JP | 2008-098607 A | 4/2008 |
| JP | 2008-147567 A | 6/2008 |
| JP | 2008-543003 A | 11/2008 |
| JP | 2008-543062 A | 11/2008 |
| WO | WO 2006/128203 A1 | 12/2006 |
| WO | WO 2006/128204 A1 | 12/2006 |
| WO | WO 2007/037184 A1 | 4/2007 |

OTHER PUBLICATIONS

Notification of Reason(s) for Refusal dated Mar. 6, 2012, with English translation.
Japanese Notification of Reason(s) for Refusal dated Jan. 8, 2013 with translation thereof.
European search report dated Nov. 27, 2012.
Wu C M L et al:"Properties of lead-free solder alloys with rare earth element additions",Materials Science and Engineering R: Reports, Elsevier Sequoia S.A., Lausanne, CH,vol. 44, No. 1, Apr. 1, 2004, pp. 1-44, XP004498264,ISSN: 0927-796X, DOI:10.1016/3.MSER. 2004.01.001.
Fulong Zhu et al:"Mechanical properties of a lead-free solder alloys", Asian Green Electronics, 2005. AGEC. Proceedings of 2005 International Conference on Shanghai, China Mar. 15-18, 2005, Piscatawau, NJ, USA,IEEE Mar. 15, 2005, pp. 107-112, XP010807569 DOI: 10.1109/AGEC.2005.1452326 ISBN: 978-0-7803-8806-2.
Paul T. Vianco et al: "The compression stress-strain behavior of Sn—Ag—Cu solder", JOM, vol. 55, No. 6, Jun. 1, 2003, pp. 50-55, XP055044799, ISSN: 1047-4838, DOI : 10.1007/s11837-003-0141-8.

* cited by examiner (a1)

(a2)

(b)

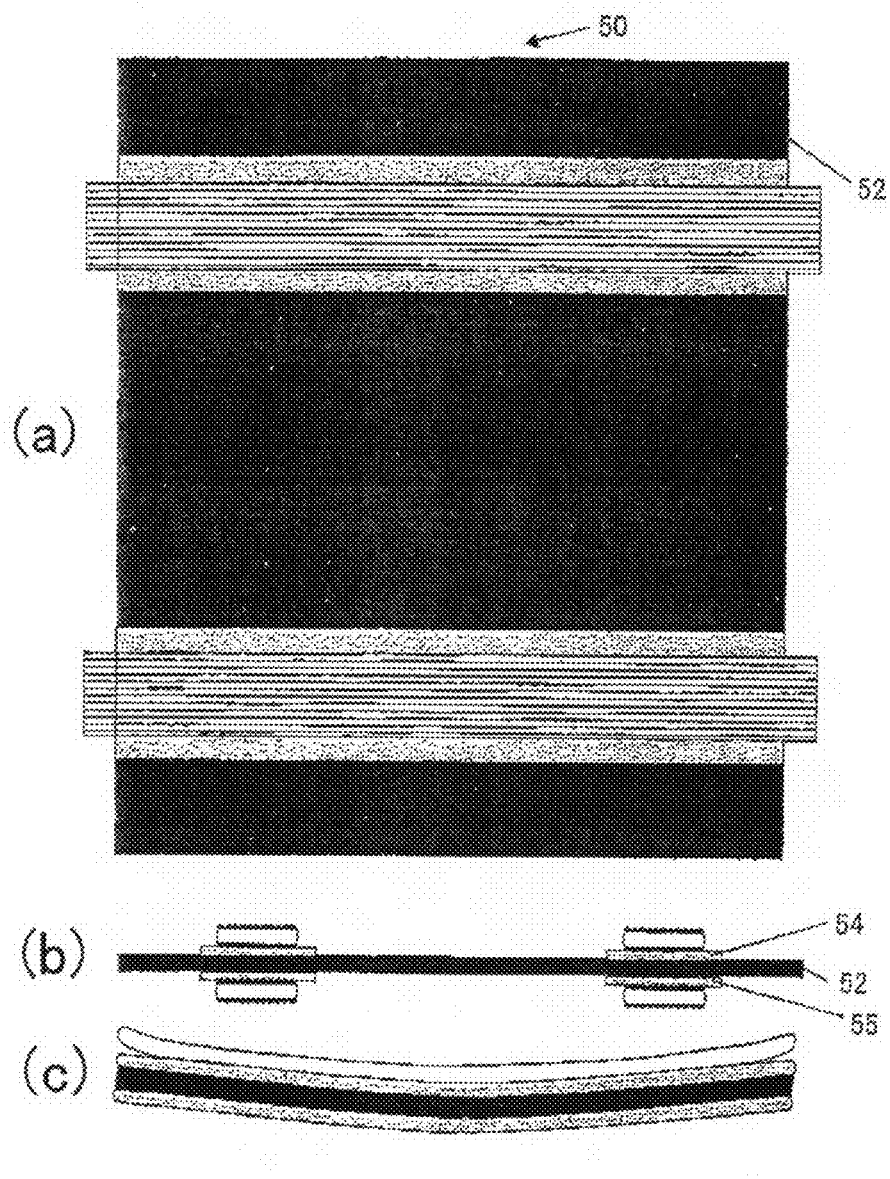

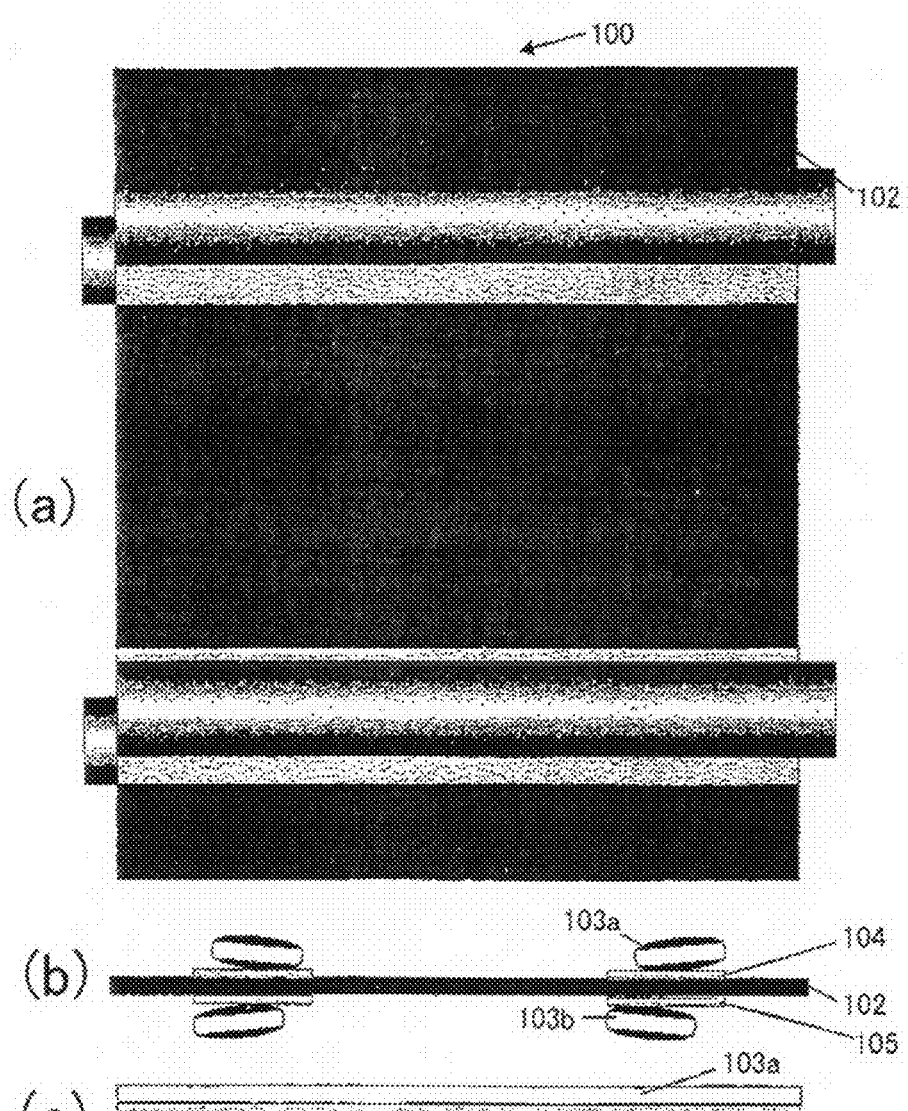

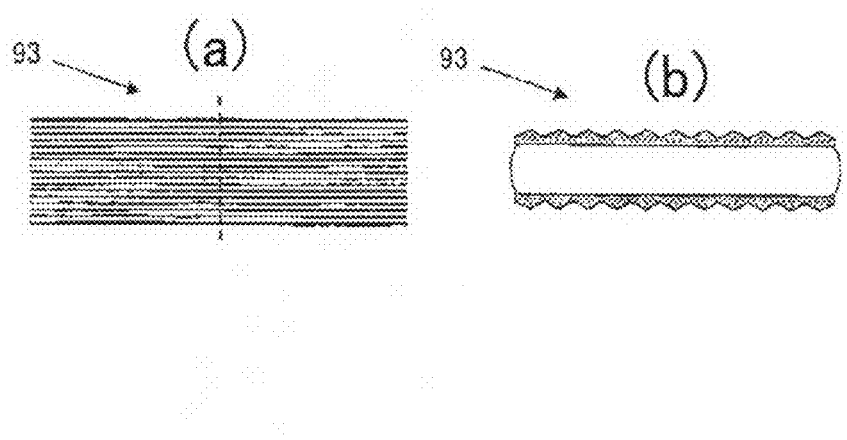
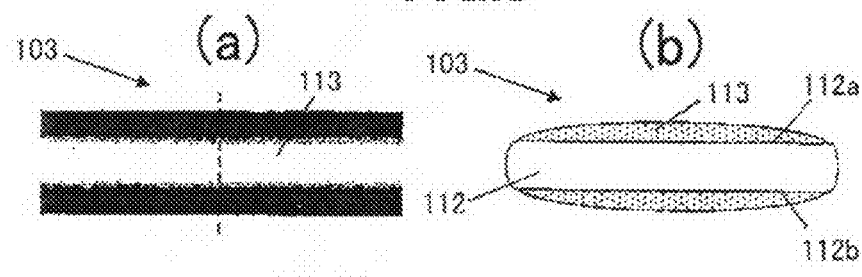

US 8,653,380 B2

SOLAR CELL LEAD, METHOD OF MANUFACTURING THE SAME, AND SOLAR CELL USING THE SAME

The present application is based on Japanese Patent Application No.2009-047033 filed on Feb. 27, 2009, the entire contents of which are incorporated herein by reference.

BACKGROUND OF THE INVENTION

1. Field of the Invention

The invention relates to a solar cell lead, in particular, to a solar cell lead excellent in bondability to a solar cell, a method of manufacturing the same and a solar cell using the same.

2. Description of the Related Art

In a solar cell, polycrystalline and single crystal Si cells are used as a semiconductor substrate.

As shown in FIGS. 6(a) to (c), a solar cell 100 is manufactured by bonding solar cell leads 103a and 103b to a predetermined region of a semiconductor substrate 102, i.e., to a front surface electrode 104 provided on a front surface of the semiconductor substrate 102 and to a back surface electrode 105 provided on a back surface thereof, using a solder or an adhesive. Electricity generated in the semiconductor substrate 102 is transmitted to the outside through a solar cell lead 103.

As shown in FIG. 8, a conventional solar cell lead 103 is provided with a strip plate conductive material 112 and hot-dip solder plating layers 113 formed on upper and lower surfaces of the strip plate conductive material 112. The strip plate conductive material 112 is formed by, e.g., roll processing a circular cross-section conductor into a ribbon shape, which is called a flat conductor or a flat wire.

The hot-dip solder plating layer 113 is formed by supplying a molten solder on the upper and lower surfaces of the strip plate conductive material 112 using a hot dipping method.

The hot dipping method is a method in which an upper surface 112a and a lower surface 112b of the strip plate conductive material 112 are cleaned by acid pickling, etc., and a solder is laminated on the upper surface 112a and the lower surface 112b of the strip plate conductive material 112 by passing the strip plate conductive material 112 through a molten solder bath. As shown in FIG. 8, the hot-dip solder plating layer 113 is formed in a shape bulging from a side portion in a width direction to a center portion, so-called a mountain-like shape, by an effect of surface tension at the time of solidification of the molten solder adhered on the upper surface 112a and the lower surface 112b of the strip plate conductive material 112.

In the conventional solar cell lead 103 shown in FIG. 8, the hot-dip solder plating layers 113 bulged in a mountain-like shape are formed on the upper and lower surfaces 112a and 112b of the strip plate conductive material 112. In the solar cell lead 103, since the hot-dip solder plating layer 113 is bulged in a mountain-like shape, it is difficult to obtain a stable laminated state at the time of winding around a bobbin, and deformation of the winding is likely to occur. In addition, a lead wire may be tangled due to the deformation of the winding, and may not be pulled out.

The solar cell lead 103 is cut to a predetermined length, is sucked up by air suction and moved onto a front surface electrode 104 of the semiconductor substrate 102 of FIG. 6, and is bonded to the front surface electrode 104 of the semiconductor substrate 102 by using a solder or an adhesive. An electrode band (not shown) electrically conducting with the front surface electrode 104 is preliminarily formed on the front surface electrode 104. The hot-dip solder plating layer 113 of a solar cell lead 103a is brought in contact with the front surface electrode 104, then, bonding is carried out by soldering or preliminary applying an adhesive. The bonding of a solar cell lead 103b to a back surface electrode 105 of the semiconductor substrate 102 is carried out in the same way.

At this time, since the hot-dip solder plating layer 113 of the solar cell lead 103a of FIG. 8 is bulged and the thickness is uneven, a contact area thereof with the an air suction jig is small and a suction force is not sufficient, hence, there is a problem of a fall during the moving operation. In addition, a contact area of the front surface electrode 104 with the hot-dip solder plating layer 113 becomes small. When the contact area of the front surface electrode 104 with the hot-dip solder plating layer 113 is small, heat conduction from the semiconductor substrate 102 to the hot-dip solder plating layer 113 is not sufficient, which results in generation of a soldering defect.

In addition, the small contact area of the front surface electrode 104 with the hot-dip solder plating layer 113 causes a misalignment between the solar cell lead 103a soldered to the front surface electrode 104 and the solar cell lead 103b soldered to the back surface electrode 105 when jointing the solar cell leads 103a and 103b to both the front and back surfaces of the semiconductor substrate 102, and a cell crack (which means that the semiconductor substrate 102 is cracked) occurs due to the misalignment. Since the semiconductor substrate 102 is expensive, a cell crack is unfavorable.

A method has been proposed in which a solder-plated wire is rolled, cut and etched for forming a concavo-convex portion on solder plating in order to increase a contact area of the front surface electrode 104 with the hot-dip solder plating layer 113 which allows rapid heating, and a decrease in module output is suppressed by increasing a contact area with a surface electrode, thereby increasing reliability (WO 2006/128204 and JP-A 2008-147567), As shown in FIG. 7, a solar cell lead 93 of WO 2006/128204 and JP-A 2008-147567 has a concavo-convex portion formed by rolling, cutting or etching a hot-dip solder plating layer which is formed on upper and lower surfaces of a strip plate conductive material. When such a solar cell lead is soldered to a front or back surface electrode of a semiconductor substrate via a hot-dip solder plating layer, the solar cell lead is tightly bonded to the semiconductor substrate and is less likely to separate therefrom, thus, excellent in durability.

As described above, according to the solar cell lead of WO 2006/128204 and JP-A 2008-147567, since the solder plating on the upper and lower surfaces is concavo-convex patterned and the plating layer is flat from lateral to middle portion in a width direction, misalignment with respect to the electrode is less likely to occur and a cell crack due to the misalignment is less likely occur. However, since the cell is likely to warp due to temperature change during the bonding to the electrode by a solder or a resin and the lead wire is thus likely to separate, there is still a problem that the module output decreases.

Thinning of semiconductor substrate has been examined since the most part of the cost of the solar cell is spent on a semiconductor substrate, however, a thinned semiconductor substrate is likely to warp and crack during bonding to an electrode. A cell crack due to warpage or separation of flat conductor is more likely to occur when a thickness of the semiconductor substrate is, e.g., 200 μm or less. If the decrease in module input is generated due to the cell cracks or the separation of flat conductor caused by a solar cell lead, the thinning of semiconductor substrate is not expected.

SUMMARY OF THE INVENTION

Therefore, it is an object of the invention to provide a solar cell lead with a high cell crack suppressing effect and high connection reliability, a method of manufacturing the same, and a solar cell using the same.

(1) According to one embodiment of the invention, a solar cell lead comprises:

a strip plate conductive material that a surface thereof is coated with solder plating, wherein said coated solder plating comprises a concavo-convex portion on a surface thereof and a 0.2% proof stress of not more than 90 MPa by a tensile test.

In the above embodiment (1), the following modifications and changes can be made.

(i) The coated solder plating comprises a hot-dip solder plating layer formed by supplying a molten solder on the surface of the strip plate conductive material, wherein a plating temperature is set to be not higher than a liquidus-line temperature of the used solder plus 120° C., and an oxide film on a surface of the hot-dip solder plating layer is set to be not more than 7 nm in thickness.

(ii) The strip plate conductive material is a flat wire having a volume resistivity of not more than 50 μΩ·mm.

(iii) The strip plate conductive material comprises one selected from Cu, Al, Ag and Au.

(iv) The strip plate conductive material comprises one selected from tough pitch Cu, low-oxygen Cu, oxygen-free Cu, phosphorus deoxidized Cu or high purity Cu having a purity of not less than 99.9999%.

(v) The hot-dip solder plating layer comprises a Sn-based solder, or, a Sn-based solder alloy using Sn as a first component and containing not less than 0.1 mass % of at least one element selected from Pb, In, Bi, Sb, Ag, Zn, Ni and Cu as a second component.

(2) According to another embodiment of the invention, a method of manufacturing a solar cell lead comprises:

forming a strip plate conductive material by rolling or slitting a wire;

after heat treatment of the strip plate conductive material, coating solder plating on a surface thereof; and forming a concavo-convex portion on a surface of the solder plating layer by using a concavo-convex patterned jig on the coated strip plate conductive material in a molten state of solder.

(3) According to another embodiment of the invention, a solar cell lead comprises:

the solar cell lead according to the embodiment (1) that is soldered by a solder in a hot-dip solder plating layer thereof, or is bonded by a resin, to front and back surface electrode of a semiconductor substrate.

Points of the Invention

According to one embodiment of the invention, a solar cell lead is constructed such that a concavo-convex portion is formed on a hot-dip solder plating layer so as to facilitate installation to front and back surface electrodes of a semiconductor substrate and to sufficiently ensure heat conduction required at the time of bonding. Furthermore, since the concavo-convex portion is formed on the plating layer in a state that the solder is molten, a core is not work-hardened, the 0.2% proof stress thereof can be maintained low and cell warpage is not likely to be generated at the time of connecting to a cell. Since the cell warpage is not likely to be generated, the separation of the lead wire is not likely to occur when the cell warps. As a result, it is possible to tightly bond to the front and back surface electrodes (the bonding with a large effective bonding area).

BRIEF DESCRIPTION OF THE DRAWINGS

Next, the present invention will be explained in more detail in conjunction with appended drawings, wherein:

FIG. 5 shows a conventional solar cell, wherein (a) is a top view of a solar cell (a horizontal direction on the paper is a vertical direction of the solar cell and a vertical direction on the paper is a horizontal direction of the solar cell), (b) is a horizontal cross sectional view and (c) is a vertical cross sectional view when a lead wire is bonded to a front surface electrode;

FIG. 6 shows a conventional solar cell, wherein (a) is a top view of a solar cell (a horizontal direction on the paper is a vertical direction of the solar cell and a vertical direction on the paper is a horizontal direction of the solar cell), (b) is a horizontal cross sectional view and (c) is a vertical cross sectional view when a lead wire is bonded to a front surface electrode;

FIG. 7 shows a conventional solar cell, wherein (a) is a top view showing a solar cell lead and (b) is a horizontal cross sectional view along a dashed line in the top view of (a); and FIG. 8 shows a conventional solar cell, wherein (a) is a top view showing a solar cell lead and (b) is a horizontal cross sectional view along a dashed line in the top view of (a).

DETAILED DESCRIPTION OF THE PREFERRED EMBODIMENTS

A preferred embodiment of the invention will be explained in detail as below in conjunction with appended drawings.

Figure 1:
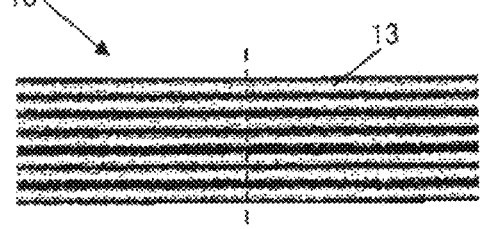
FIG. 1 shows a preferred embodiment of the present invention, wherein (a1) is a top view showing a solar cell lead, (a2) is a horizontal cross sectional view along a dashed line in the top view of (a1), and (b) is a schematic perspective view showing a strip plate conductive material to be a material of the solar cell lead.
Figure 1:
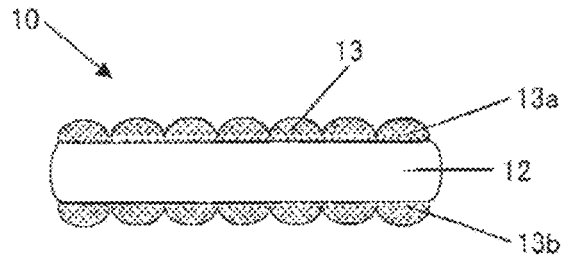
Figure 1:
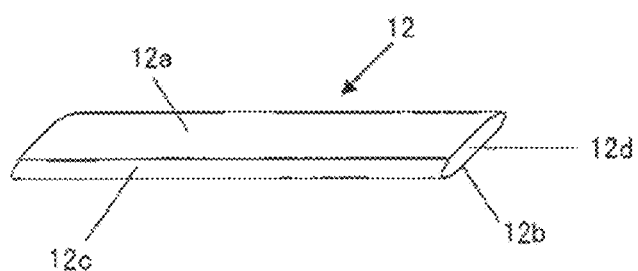

As shown in FIG. 1(*a*2), a solar cell lead 10 of the invention has upper and lower hot-dip solder plating layers 13*a* and 13*b* having a concavo-convex portion which is formed by supplying a molten solder on upper and lower surfaces of a strip plate conductive material 12 and sandwiching the strip plate conductive material 12 by a preliminarily concavo-convex patterned jig (e.g., a roll) at a solder bath outlet port in a molten state of solder while adjusting a plating thickness. Herein, the molten state of solder means a solid-liquid coexistence state in which solid and liquid solders coexist.

A wire (a wire rod having a circular cross section) is roll-processed and is heat-treated in a continuous electrical heating furnace, a continuous heating furnace or a batch-type heating equipment, thereby forming the strip plate conductive material 12.

FIG. 1(*b*) is a perspective view showing the strip plate conductive material 12. An upper surface 12*a* and a lower surface 12b are flat surfaces, a side surface 12c is formed to be convexly bulged and an edge surface 12d is formed by cutting to an appropriate length.

Figure 3:
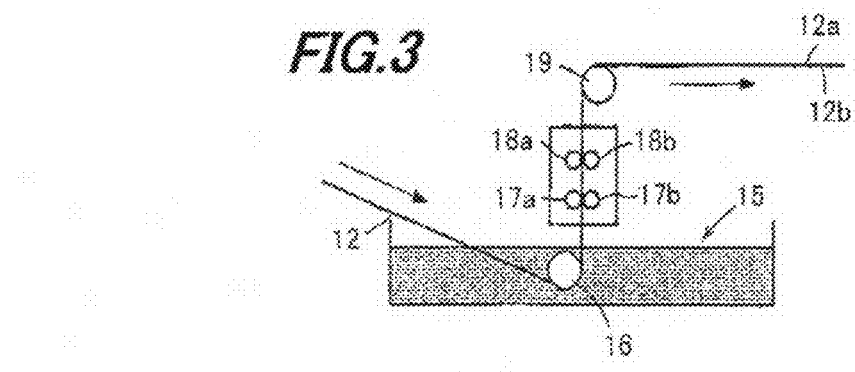
FIG. 3 is a schematic view showing a hot-dip plating equipment for forming a hot-dip solder plating layer of the invention.

FIG. 3 shows a hot-dip plating equipment for forming a concavo-convex portion on the hot-dip solder plating layers 13a, 13b. A reverse roll 16 is provided in a solder bath 15 for reversing and upwardly directing the strip plate conductive material 12, a pair of lower rolls and upper rolls 17a, 17b, 18a and 18b located above the reverse roll 16 is provided above the solder bath 15, and a lifting roll 19 is provided thereon. The lower rolls 17a and 17b are preliminarily concavo-convex patterned for forming a concavo-convex portion on the plating.

The solder is supplied on upper and lower surfaces of the strip plate conductive material 12 by being dipped in the solder bath 15, the strip plate conductive material 12 is revered at the reverse roll 16 and is directed upwards, and a concavo-convex portion is formed by being sandwiched at the lower rolls 17a and 17b. A position of a core (Cu) is adjusted at the upper rolls 18a and 18b, thereby manufacturing the solar cell lead 10 having the concavo-convex portion formed on the hot-dip solder plating layers 13a, 13b, as shown in FIG. 1(a2).

The lower and upper rolls 17a, 17b, 18a and 18b for forming the hot-dip solder plating layers 13a, 13b having the concavo-convex portion on the strip plate conductive material 12 are arranged so as to sandwich the upper and lower surfaces of the strip plate conductive material 12 at the outlet port of the solder bath 15, and a plating thickness of the hot-dip solder plating layers 13a, 13b and a horizontal cross sectional shape of the plating layer 13 can be adjusted by finely adjusting gaps between the lower and upper rolls 17a, 17b, 18a and 18b. In addition, although a method of sandwiching by a pair of rolls is explained here as a method of forming a concavo-convex portion on the solder plating layer 13 it is not limited thereto, and it is possible to form by passing a solder plating coated flat conductor through a dice of which inside is concavo-convex patterned.

Figure 2:
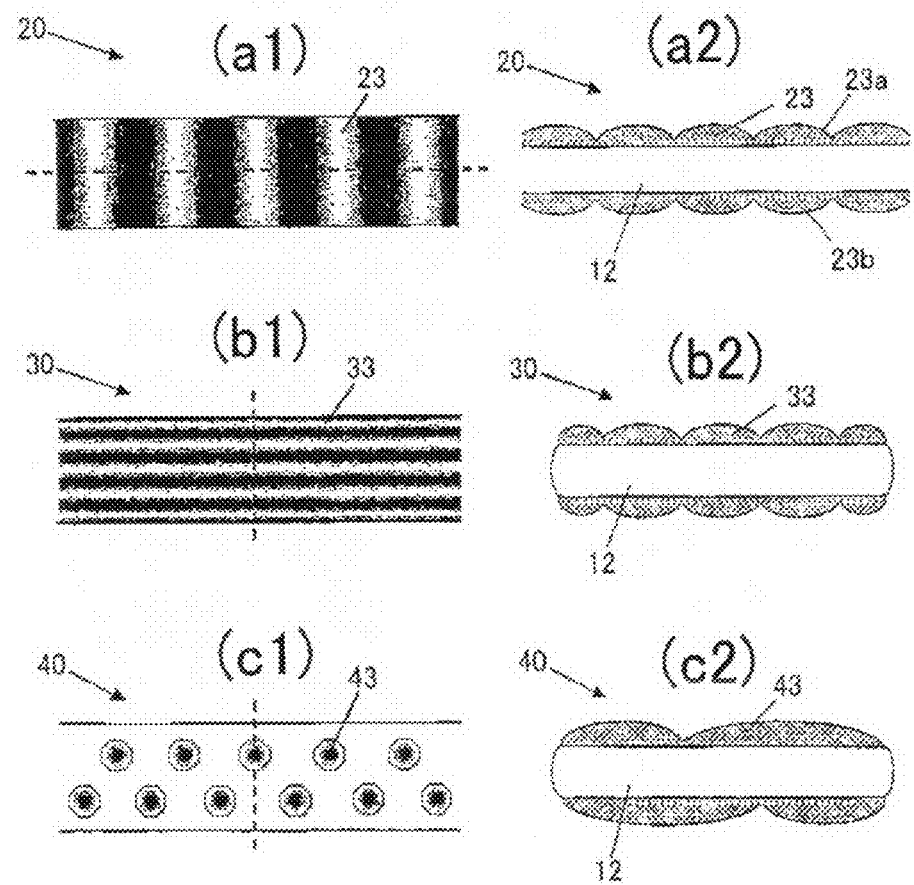
FIG. 2 shows a solar cell lead in other embodiments of the invention, wherein (a1) is a top view showing a solar cell lead, (a2) is a vertical cross sectional view along a dashed line in the top view of (a1), (b1) is a top view showing a solar cell lead, (b2) is a horizontal cross sectional view along a dashed line in the top view of (b1), (c1) is a top view showing a solar cell lead and (c2) is a horizontal cross sectional view along a dashed line in the top view of (c1)

FIG. 2 shows the solar cell leads of the invention having other shapes.

A solar cell lead 20 of FIG. 2(a2) is formed so that a stripe pattern of concavity and convexity which is perpendicularity to a longitudinal direction of the wire is arranged on hot-dip solder plating layers 23 on the upper and lower surfaces of the strip plate conductive material 12.

In addition, a solar cell lead 30 of FIG. 2(b2) is formed so that a stripe pattern of concavity and convexity which is parallel to a longitudinal direction of the wire is arranged on hot-dip solder plating layers 33 on the upper and lower surfaces of the strip plate conductive material 12.

In addition, a solar cell lead 40 of FIG. 2(c2) is formed so that the knurling process is applied to a hot-dip solder plating layer 43 on the upper and lower surfaces of the strip plate conductive material 12.

These shapes can be formed by adjusting an amount of molten solder plating, gaps and positions of the lower and upper rolls 17a, 17b, 18a and 18b and by changing a concavo-convex portion on the rolls 17a and 17b of the hot-dip plating equipment of FIG. 3.

In other words, a path of the strip plate conductive material 12 running up and down in the hot-dip plating equipment of FIG. 3 is determined by the reverse roll 16 and the lifting roll 19 when the hot-dip solder plating layers 13, 23 and 43 are formed on the upper and lower surfaces of the strip plate conductive material 12, and a layer thickness of an upper hot-dip solder plating layer 23a, that of a lower hot-dip solder plating layer 23b and the entire layer thickness can be adjusted by finely adjusting the positions and the gaps of each of the lower and upper rolls 17a, 17b, 18a and 18b with respect to the path, the entire layer thickness and a concavo-convex shape is determined by the gap between the lower rolls 17a and 17b, and the position of the strip plate conductive material 12 as a core is determined by the gap between the upper rolls 18a and 18b.

Since a height of the roll with respect to a solder plating furnace is fixed at a position where the solder plating does not completely solidify, the concavity and convexity on the plated surface becomes a rounded shape due to an effect of surface tension. In addition, since a concavo-convex portion is formed on the solder plating in a molten state, the strip plate conductive material 12 as a core is not work-hardened, and a 0.2% proof stress thereof can be maintained low.

When a conductor width of the strip plate conductive material 12 shown in FIG. 2 is equivalent to an electrode width, the solder which contribute to bond a strip plate conductive material to a semiconductor substrate is excessively supplied to a bonding portion of front and back surface electrodes by suppressing the amount of the solder to be supplied and flows out to a portion other than the electrodes, thereby preventing a cell light-receiving surface from diminishing. As a result, it is possible to obtain a solar cell lead excellent in shadow loss suppression.

As described above, in the solar cell leads 10, 20, 30 and 40 of the invention, a concavo-convex portion is formed on the hot-dip solder plating layers 13, 23, 33 and 43 so as to facilitate installation to front and back surface electrodes of a semiconductor substrate and to sufficiently ensure heat conduction required at the time of bonding. Furthermore, since the concavo-convex portion is formed on the plating layer in a state that the solder is molten, a core is not work-hardened, the 0.2% proof stress thereof can be maintained low and cell warpage is not likely to be generated at the time of connecting to a cell. Since the cell warpage is not likely to be generated, the separation of the lead wire is not likely to occur when the cell warps. As a result, it is possible to tightly bond to the front and back surface electrodes (the bonding with a large effective bonding area).

The strip plate conductive material 12 is formed of, e.g., a flat wire of which volume resistivity is 50 μΩ·mm or less. By roll-processing the flat wire, it is possible to obtain the strip plate conductive material 12 having a horizontal cross-sectional shape as shown in FIG. 1(b).

The strip plate conductive material 12 is formed of any of Cu, Al, Ag and Au, or any of tough pitch Cu, low-oxygen Cu, oxygen-free Cu, phosphorus deoxidized Cu and high purity Cu having a purity of 99.9999% or more.

As the hot-dip solder plating layer, a Sn-based solder (a Sn-based solder alloy) is used. In the Sn-based solder, Sn is used as a first component of which component weight is the heaviest, and 0.1 mass % or more of at least one element selected from Pb, In, Bi, Sb, Ag, Zn, Ni and Cu is contained as a second component.

The effect of the invention will be explained below.

Figure 4:
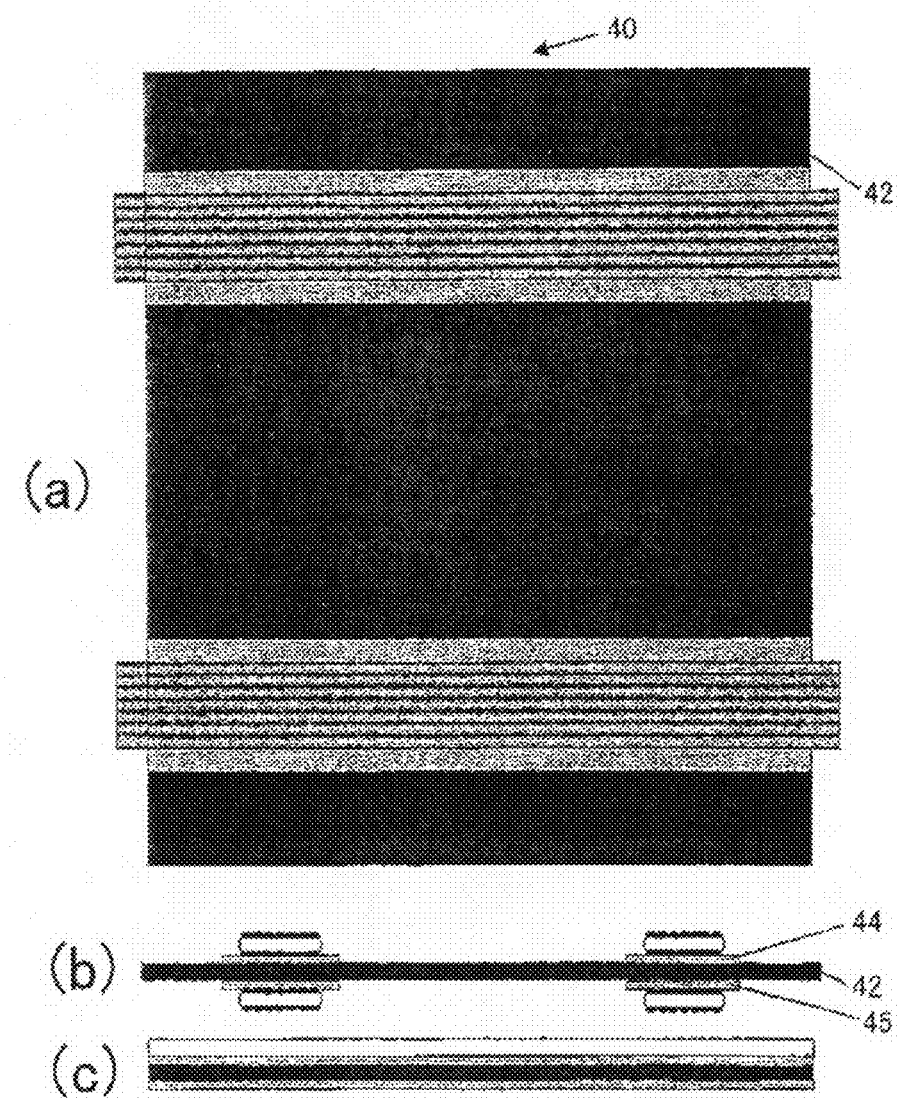
FIG. 4 shows a solar cell lead of the invention, wherein (a) is a top view of a solar cell (a horizontal direction on the paper is a vertical direction of the solar cell and a vertical direction on the paper is a horizontal direction of the solar cell), (b) is a horizontal cross sectional view and (c) is a vertical cross sectional view when a lead wire is bonded to a front surface electrode.

For bonding the solar cell lead 10 shown in FIG. 1(a1) to a front surface electrode 44 and a back surface electrode 45 of a semiconductor substrate 42 shown in FIG. 4, a heating temperature of the solar cell lead 10 or a semiconductor substrate 52 is controlled to a temperature near a melting point of the solder in the hot-dip solder plating layer 13 or near curing temperature of resin. The reason is that a thermal expansion coefficient of the strip plate conductive material 12 of the solar cell lead 10 is largely different from that of a semiconductor substrate (Si). Heat stress which causes generation of warpage and a crack on the semiconductor substrate 42 is generated due to the difference in the thermal expansion coefficient. It is only needs to decrease the 0.2% proof stress of the lead wire in order to decrease the heat stress. Thus, since compressive stress generated in the cell is reduced when the lead wire heated during the bonding is cooled, the warpage of the cell is reduced and it is thereby possible to prevent the separation of the lead wire which occurs by the cell warpage. Therefore, the 0.2% proof stress of the lead wire is desirably 90 MPa or less. In addition, a bonding temperature should be as low as possible in order to decrease thermal expansion strain during the bonding. Thus, the heating temperature of the solar cell lead 10 or the semiconductor substrate 42 is controlled to a temperature near the melting point of the solder in the hot-dip solder plating layer 13, or in order to further decrease the heat stress to be generated, controlled to near the curing temperature of resin, conductive paste or an anisotropic conductive film which can be bonded at a temperature lower than the solder.

In the above-mentioned heating method during the bonding, for example, the semiconductor substrate 42 is placed on a hot plate, and heat from the hot plate is used together with heat from upside of the solar cell lead 10 placed on the semiconductor substrate 42.

In order to increase the contact area of the front surface electrode 44 and the back surface electrode 45 of the semiconductor substrate 42 with the hot-dip solder plating layer 13 for obtaining sufficient heat conduction from the semiconductor substrate 42 to the hot-dip solder plating layer 13, the solar cell lead 10 including the hot-dip solder plating layer 13 should be in a rectangular shape having a concavo-convex portion on a surface thereof. In addition, in order to prevent the separation of the lead wire due to the cell warpage, the 0.2% proof stress of the lead wire must be 90 MPa or less.

However, since the soldered surface of the conventional solar cell lead 93 shown in FIG. 7 is processed by rolling or cutting, the shape of the concavo-convex portion is sharp and the 0.2% proof stress of the lead wire is high. Therefore, as shown in FIG. 5, the warpage is generated on the semiconductor substrate when bonding to a front surface electrode 54 of the semiconductor substrate 52. Thus, the separation occurs between the lead wire and the semiconductor substrate and sufficient conduction is not obtained, which results in a decrease in the module output. On the other hand, in the lead wire of the invention, formation of the concavo-convex portion is carried out in the molten state of solder in order to suppress the 0.2% proof stress low. As a result, a shape of the concavo-convex portion on the solder plating of the lead wire is rounded.

In the invention, since it is possible to control the thinning of the plating layer occurring during the high-speed hot-dip solder plating by squeezing and removing the molten solder at the rolls 17 and 18, a predetermined plating thickness can be formed faster than the conventional art, and it is excellent in mass productivity. As a result, the invention can provide a solar cell lead most effective in the suppression of cell cracks and in the connection reliability.

Next, Table 1 shows physicality of the material of the strip plate conductive material used in the invention.

TABLE 1

| | Material | | | |
| --- | --- | --- | --- | --- |
| | Cu | Ag | Au | Al |
| Thermal expansion coefficient ($\times 10^{-6}$/° C.) | 17.0 | 19.1 | 29.1 | 23.5 |
| 0.2% proof stress (MPa) | 40 | 55 | 30 | 20 |
| Volume resistivity ($\mu\Omega \cdot$ mm) | 16.9 | 16.3 | 22.0 | 26.7 |

The strip plate conductive material is preferably composed of a material having relatively small volume resistivity. As shown in Table 1, the material of the strip plate conductive material is Cu, Al, Ag or Au, etc.

The volume resistivity of the Ag is the lowest among Cu, Al, Ag and Au. Therefore, when Ag is used as the strip plate conductive material, it is possible to maximize power generation efficiency of a solar cell using the solar cell lead. When Cu is used as the strip plate conductive material, it is possible to reduce cost of the solar cell lead. When Al is used as the strip plate conductive material, it is possible to reduce weight of the solar cell leads 10, 20, 30 and 40.

When Cu is used as the strip plate conductive material, any of tough pitch Cu, low-oxygen Cu, oxygen-free Cu, phosphorus deoxidized Cu or high purity Cu having a purity of 99.9999% or more may be used for the Cu. In order to minimize the 0.2% proof stress of the strip plate conductive material, it is advantageous to use highly-pure Cu. Therefore, when the high purity Cu having a purity of 99.9999% or more is used, it is possible to decrease the 0.2% proof stress of the strip plate conductive material. When the tough pitch Cu or the phosphorus deoxidized Cu is used, it is possible to reduce cost of the solar cell lead.

A solder used for the hot-dip solder plating layer includes a Sn-based solder, or a Sn-based solder alloy in which Sn is used as a first component and 0.1 mass % or more of at least one element selected from Pb, In, Bi, Sb, Ag, Zn, Ni and Cu is contained as a second component. These solders may contain 1000 ppm or less of trace element as a third component.

A method of manufacturing the solar cell lead of the invention will be explained below.

Firstly, a strip plate conductive material is formed by rolling a wire rod having a circular cross section (shot shown) which is a row material. The strip plate conductive material is heat-treated in a continuous electrical heating furnace, a continuous heating furnace or a batch-type heating equipment. Then, a concavo-convex portion is formed on a hot-dip solder plating layer by supplying a molten solder using a plating line such as shown in FIG. 3.

On the other hand, as for a conventional solar cell lead, plating is carried out and subsequently a concavo-convex portion is formed on a plated surface by rolling, cutting or etching in a state that the solder plating is solid. Since the work-hardening also occurs in no small part in a core of the lead wire when being rolled or cut, the 0.2% proof stress of the lead wire increases. On the other hand, in case of processing into the concavo-convex portion by etching, although the increase in the 0.2% proof stress is suppressed, it is not possible to continuously treat in a short time, thus, poor in the mass productivity.

In general, a solid or a liquid has a property to become as small as possible since intermolecular force functions between internal molecules inside the solid or the liquid. Since the molecule on the surface is surrounded by different molecules on one side, it is in a high internal energy state, and the excess energy is changing into a stable state. In case that a solder (liquid) is in contact with air, since the intermolecular force in the air is extremely small compared with that in the solder, the molecules on the surface of the solder is not pulled by the molecules on the air side, hence, is pulled only by the molecules inside the solder. Therefore, the molecules on the solder surface are constantly entering into the solder and, as a result, the solder surface is becoming a spherical shape with the smallest surface area (with few elements for composing the solder).

In the solar cell leads 10, 20, 30 and 40 of the invention shown in FIGS. 1 and 2 and the conventional solar cell lead 103 without concavity and convexity shown in FIG. 8, the hot-dip solder plating layers solidified in a concavo-convex shape composed of curved surfaces or in a shape bulging like a bump are formed on the upper and lower surfaces of the strip plate conductive material by such a force acting to decrease the surface area (surface tension). The solder which normally comes in a spherical shape does not become a spherical shape because interactive force at an interface with the strip plate conductive material (interfacial tension between the solder and the strip plate conductive material) acts on the solder.

As a method for processing a raw material into a strip plate conductive material, both a rolling process and a slit processing are applicable. The rolling process is a method to rectangularize a round wire by rolling. When the strip plate conductive material is formed by the rolling process, it is possible to form a long strip plate conductive material having a uniform width in a longitudinal direction. Materials having various widths can be dealt by the slit processing. In other words, even when a width of a raw conductive material is not uniform in a longitudinal direction or even when various raw conductive materials having different widths are used, it is possible to form the long strip plate conductive material having a uniform width in a longitudinal direction by the slit processing.

It is possible to improve softening characteristics of the strip plate conductive material by heat treating the strip plate conductive material. Improving the softening characteristics of the strip plate conductive material is advantageous for reducing the 0.2% proof stress. A heat treatment method includes continuous electrical heating, continuous heating and batch heating. The continuous electrical heating and the continuous heating are preferable for continuously heat treating over a long length. When stable heat treatment is required, the batch heating is preferable. From the point of view of preventing oxidation, it is preferable to use a furnace with an inert gas atmosphere such as nitrogen, etc., or a hydrogen reduction atmosphere.

The furnace with an inert gas atmosphere or with a hydrogen reduction atmosphere is provided by the continuous electrical heating furnace, the continuous heating furnace or the batch-type heating equipment.

Next, a solar cell of the invention will be explained in detail.

As shown in FIGS. 4(a) to (c), in a solar cell 40, the solar cell lead 10 (or 20, 30 or 40) as has been described above is bonded to the front surface electrode 44 and the back surface electrode 45 of the semiconductor substrate 42 by the solder in the hot-dip solder plating layer 13 or a resin. In this regard, however, an oxide film thickness on the solder plated surface is desirably 7 nm or less for solder joint. If the thickness of the oxide film exceeds 7 nm, it is difficult to remove the oxide film when the solar cell lead is soldered to an electrode on a cell, and the soldering of the solar cell lead to the electrode will be insufficient. The thickness of the oxide film can be defined by, e.g., the time when a peak value of oxygen decreases by half where a sputtering rate is $SiO^2$ conversion in a depth profile obtained by Auger analysis. As a method of adjusting the oxide film thickness on the solder plated surface to be 7 nm or less, there is a method in which hot-dip plating is carried out by setting a plating temperature to less than liquidus-line temperature of the used solder plus 120° C.

Since the concavo-convex portion is formed on the hot-dip solder plating layer which becomes a bonding surface of the solar cell lead 10 with the front surface electrode 44, the position of the solar cell lead 10 is stabilized on an electrode of the semiconductor substrate 42, thereby preventing a misalignment. In addition, since it is possible to have a large effective bonding area with an electrode having multiple concavo-convex portions, it is possible to decrease contact resistance. Furthermore, since the 0.2% proof stress of the lead wire is decreased, the semiconductor substrate 42 is less likely to warp during the bonding and the separation of the lead wire due to the warpage is less likely to be generated.

According to the solar cell 40 of the invention, since it is possible to have a large effective bonding area between the solar cell lead 10 and the semiconductor substrate and to suppress a cell crack during the bonding, it is possible to improve output and yield of the solar cell.

EXAMPLES

Example 1

A Cu material as a raw conductive material was roll processed, thereby forming a strip plate conductive material in a rectangular shape of 1.0 mm in width and 0.2 mm in thickness. The strip plate conductive material was heat-treated in a continuous heating furnace, and further, Sn-3% Ag-0.5% Cu solder plating was applied on the peripheral surface of the strip plate conductive material in the hot-dip plating equipment shown in FIG. 3, thereby forming a hot-dip solder plating layer having a concavo-convex portion (a plating thickness is 40 μm at a convex portion) on upper and lower surfaces of the strip plate conductive material (a conductor is a heat-treated Cu). From the above process, the solar cell lead 10 of FIG. 1(a2) was obtained. The 0.2% proof stress was calculated by dividing a 0.2% proof stress point load by a cross section of the conductor, in which the 0.2% proof stress point load was derived from S-S curve obtained as a result of a tensile test under a stretching speed of 20 mm/min, and it was 60 MPa.

Examples 2-5, Comparative Example 1, Examples 6-8 and Comparative Example 6

A strip plate conductive material was formed in the same manner as the solar cell lead 10 of Example 1 and was heat-treated in a continuous heating furnace changing a heating temperature (heat treatment is conducted at the same temperature in Examples 4-8 and Comparative Example 6), and further, Sn-3% Ag-0.5% Cu solder plating was applied on the peripheral surface of the strip plate conductive material in the hot-dip plating equipment shown in FIG. 3 by using the same concavo-convex patterned roll as Example 1 in Examples 2 to 5 and Comparative Example 1, using a roll having a different concavo-convex pattern in Examples 6 to 8 and without using a roll at all in Comparative Example 6, thereby forming a hot-dip solder plating layer having a concavo-convex portion (a plating thickness is 40 μm at a convex portion) on upper and lower surfaces of the strip plate conductive material (a conductor is a heat-treated Cu). From the above process, the solar cell lead 10 shown in FIG. 1(*a*2) was obtained in Examples 2 to 5 and Comparative Example 1, the solar cell lead 10 shown in FIG. 2(*a*2) was obtained in Example 6, the solar cell lead 10 shown in FIG. 2(*b*2) was obtained in Example 7, the solar cell lead 10 shown in FIG. 2(*c*2) was obtained in Example 8 and the solar cell lead 10 shown in FIG. 8 was obtained in Comparative Example 6. The 0.2% proof stress was 70 MPa in Example 2, 80 MPa in Example 3, 90 MPa in Example 4, 90 MPa in Example 5, 100 MPa in Comparative Example 1, 90 MPa in Examples 6 to 8, and 90 MPa in Comparative Example 6.

Comparative Examples 2 to 5

A Cu material as a raw conductive material was roll processed, thereby forming a strip plate conductive material of in a rectangular shape of 1.0 mm in width and 0.2 mm in thickness. The strip plate conductive material was heat-treated in a continuous heating furnace (heat treatment is conducted at the same temperature in Examples 4-8), and further, Sn-3% Ag-0.5% Cu solder plating was applied on the peripheral surface of the strip plate conductive material in the hot-dip plating equipment, thereby forming a hot-dip solder plating layer (a plating thickness is 40 μm at a middle portion) on upper and lower surfaces of the strip plate conductive material (a conductor is a heat-treated Cu). Then, a concavo-convex portion was formed on the solder plating layer by rolling with a concavo-convex patterned roll in Comparative Examples 2 and 3, by cutting in Comparative Example 4 and by etching Comparative Example 5. From the above process, the solar cell lead 93 of FIG. 7 was obtained. The 0.2% proof stress was 120 MPa in Comparative Examples 2 to 4 and 90 MPa in Comparative Example 5.

An appropriate amount of rosin based flux was applied to the solar cell leads of Examples 1-4, Comparative Example 1, Examples 6-8, Comparative Example 2 and Comparative Examples 4-6, each solar cell lead was placed on electrode sites on an upper surface of a semiconductor substrate (Si cell) which is 150 mm high×150 mm wide×180 μm thick, and was soldered by performing hot plate heating (maintaining at 260° C. for 30 seconds) in a state that 10 g of weight was placed. On the other hand, a conductive adhesive (Ag/epoxy system) was applied to the solar cell leads of Example 5 and Comparative Example 3, each solar cell lead was placed on electrode sites on an upper surface of a semiconductor substrate (Si cell) which is 150 mm high×150 mm wide×180 μm thick, and was bonded by performing hot plate heating (maintaining at 180° C. for 3 minutes) in a state that 10 g of weight was placed. The separation status of the lead wire which occurs due to the cell warpage generated during the bonding was examined.

Evaluation results of Examples 1 to 8 and Comparative Examples 1 to 6 are shown in Table 2.

TABLE 2

| | Method of forming concavo-convex portion on plating | Cross sectional shape | 0.2% proof stress (MPa) | Cell connecting method | Bonding area | Mass production cost |
| --- | --- | --- | --- | --- | --- | --- |
| Example 1 | Hot-dip roll plating | FIG. 1(a2) | 60 | Solder | ◯ | ◯ |
| Example 2 | Hot-dip roll plating | FIG. 1(a2) | 70 | Solder | ◯ | ◯ |
| Example 3 | Hot-dip roll plating | FIG. 1(a2) | 80 | Solder | ◯ | ◯ |
| Example 4 | Hot-dip roll plating | FIG. 1(a2) | 90 | Solder | ◯ | ◯ |
| Example 5 | Hot-dip roll plating | FIG. 1(a2) | 90 | Adhesive | ◯ | ◯ |
| Comparative Example 1 | Hot-dip roll plating | FIG. 1(a2) | 100 | Solder | X | ◯ |
| Example 6 | Hot-dip roll plating | FIG. 2(a2) | 90 | Solder | ◯ | ◯ |
| Example 7 | Hot-dip roll plating | FIG. 2(b2) | 90 | Solder | ◯ | ◯ |
| Example 8 | Hot-dip roll plating | FIG. 2(c2) | 90 | Solder | ◯ | ◯ |
| Comparative Example 2 | Rolling process | FIG. 7(b) | 120 | Solder | X | Δ |
| Comparative Example 3 | Rolling process | FIG. 7(b) | 120 | Adhesive | X | Δ |
| Comparative Example 4 | Cutting process | FIG. 7(b) | 120 | Solder | X | Δ |
| Comparative Example 5 | Etching | FIG. 7(b) | 90 | Solder | ◯ | X |
| Comparative Example 6 | No process | FIG. 8(b) | 90 | Solder | X | ◯ |

The section of "Method of forming concavo-convex portion on plating" in Table 2 indicates a method of forming a concavo-convex portion on upper and lower surfaces of a strip plate conductive material having a rectangular shape. The section of "Cross sectional shape" indicates the figure number corresponding to the cross sectional shapes. The section of "0.2% proof stress" indicates the 0.2% proof stress of the lead wire obtained as a result of the tensile test. The section of "Cell connecting method" indicates a method of connecting the lead wire to an electrode on the cell (solder or adhesive). The section of "Bonding area" indicates a result of evaluating a ratio of the effective bonding area by X-ray in a state that the temperature returns to a normal level after the bonding of the lead wire to the cell, then, the ratio of the effective bonding area is evaluated as "O (good)" for 90% or more and "X (bad)" for less than 90%. The ratio of the effective bonding area was calculated by the formula below. In the section of "Mass production cost", the manufacturing cost is evaluated as "O"for less than 1.2, "Δ(not good)" for 1.2-1.5 and "X" for over 1.5, where the cost of the conventional molten plating is 1.0.

(Ratio of effective bonding area)=[(total sum of bonding area)/(projected area of lead wire)]×100

As shown in Table 2, it was confirmed that the total sum of the bonding area is large in the solar cell leads of Examples 1 to 8 since the 0.2% proof stress is low and there is less cell warpage. In addition, since it is the method in which the concavo-convex portion is formed on the molten solder in a hot-dip plating line, the mass production cost is substantially equivalent to the conventional solder plated wire and it is the method which is industrially excellent.

In contrast, even the manufacturing process is the same as Examples 1 to 8, in Comparative Example 1 in which an annealing temperature of the core (Cu) is low, the 0.2% proof stress of the wire lead is high and the total sum of the bonding area becomes small due to the influence of the cell warpage during the bonding. In Comparative Examples 2 to 4, since the rolling or cutting process was performed for forming a concavo-convex portion on the solder plating, the 0.2% proof stress of the wire lead becomes high due to the work-hardening of the core (Cu) of the wire lead, and the total sum of the bonding area becomes small due to the influence of the cell warpage during the bonding in the same manner. In addition, since the processing of the concavo-convex portion is performed in another process, the mass production cost becomes high. In Example 5, since the solder plating is etched for forming a concavo-convex portion thereon, the core (Cu) of the lead wire is not work-hardened and the 0.2% proof stress of the wire lead can be maintained low, thus, the influence of the cell warpage during the bonding is small and the total sum of the bonding area can be increased. However, since the etching process takes long time, the mass production cost becomes high and the industrial value is extremely low. In Comparative Example 6, the 0.2% proof stress is low since no processing is performed, however, the total sum of the bonding area is small because the solder plating has a mountain-like shape.

As described above, from the evaluation results of Exampled to 8 and Comparative Examples 1 to 6, it was confirmed that it is possible to increase a large effective bonding area of the solar cell lead of the invention with the cell.

Although the invention has been described with respect to the specific embodiment for complete and clear disclosure, the appended claims are not to be therefore limited but are to be construed as embodying all modifications and alternative constructions that may occur to one skilled in the art which fairly fall within the basic teaching herein set forth.

What is claimed is:

1. A solar cell lead, comprising:
    a strip plate conductive material; and
    a solder plating coated on a surface of the strip plate conductive material, the solder plating being configured to be plated in an electrode site of a Si semiconductor substrate, and the coated solder plating comprising a concavo-convex portion on a surface thereof,
    wherein the concavo-convex portion is formed on the coated solder plating in a solid-liquid coexistence state, thereby, the coated solder plating comprises a 0.2% proof stress of not more than 90 MPa by a tensile test of the solar cell lead,
    wherein the concavo-convex portion comprises a stripe pattern or a zigzag pattern of concavity in a longitudinal direction of the strip plate conductive material, and
    wherein, in a plan view, the concavo-convex portion extends across the strip plate conductive material.

2. The solar cell lead according to claim 1, wherein said coated solder plating comprises a hot-dip solder plating layer formed by supplying a molten solder on the surface of the strip plate conductive material,
    wherein a plating temperature is set to be not higher than a liquidus-line temperature of the used solder plus 120° C., and
    wherein an oxide film on a surface of the hot-dip solder plating layer is set to be not more than 7 nm in thickness.

3. The solar cell lead according to claim 1, wherein the strip plate conductive material comprises a flat wire having a volume resistivity of not more than 50 μΩ·mm.

4. The solar cell lead according to claim 1, wherein the strip plate conductive material comprises one selected from Cu, Al, Ag and Au.

5. The solar cell lead according to claim 1, wherein the strip plate conductive material comprises one selected from tough pitch Cu, low-oxygen Cu, oxygen-free Cu, phosphorus deoxidized Cu or high purity Cu having a purity of not less than 99.9999%.

6. The solar cell lead according to claim 1, wherein the hot-dip solder plating layer comprises a Sn-based solder, or a Sn-based solder alloy using Sn as a first component and containing not less than 0.1 mass % of at least one element selected from Pb, In, Bi, Sb, Ag, Zn, Ni, and Cu as a second component.

7. A solar cell lead, comprising:
    the solar cell lead according to claim 1 that is soldered by a solder in a hot-dip solder plating layer thereof, or is bonded by a resin, to front and back surface electrode of a semiconductor substrate.

8. The solar cell lead according to claim 1, wherein, in the solid-liquid coexistence state, a solder of the solder plating is in a molten state.

9. The solar cell lead according to claim 1, wherein the concavo-convex portion comprises a stripe pattern of concavity and convexity which is perpendicular to a longitudinal direction of the strip plate conductive material.

10. The solar cell lead according to claim 1, wherein the concavo-convex portion comprises a stripe pattern of concavity and convexity which is parallel to a longitudinal direction of the strip plate conductive material.

11. A solar cell lead, comprising:
    a strip plate conductive material having a rectangular shape; and
    a solder plating coated on a surface of the strip plate conductive material, the solder plating being configured to be plated in an electrode site of a Si semiconductor substrate, and the coated solder plating comprising a plurality of concave portions on a surface thereof, wherein the concave portions are formed on the coated solder plating in a solid-liquid coexistence state, such that the coated solder plating comprises a 0.2% proof stress of not more than 90 MPa by a tensile test of the solar cell lead, wherein the concavo-convex portion comprises a stripe pattern or a zigagpattern of concavity in a longitudinal direction of the strip plate conductive material, and wherein, in a plan view, the concavo-convex portion extends across the strip plate conductive material.

12. A solar cell lead, comprising:

a strip plate conductive material; and a solder plating coated on a surface of the strip plate conductive material, the solder plating being plated in an electrode site of a semiconductor substrate, and the coated solder plating comprising a concavo-convex portion on a surface thereof, wherein the concavo-convex portion is formed on the coated solder plating in a solid-liquid coexistence state, and wherein the concavo-convex portion comprises a stripe pattern or a zigzag pattern of concavity in a longitudinal direction of the strip plate conductive material, wherein the concavo-convex portion is formed on the coated solder plating in a solid-liquid coexistence state, thereby, the coated solder plating comprises a 0.2% proof stress of not more than 90 MPa by a tensile test of the solar cell lead, and wherein, in a plan view, the concavo-convex portion extends across the strip plate conductive material.

* * * * *